US012676618B2

(12) United States Patent
Toi

(10) Patent No.: US 12,676,618 B2
(45) Date of Patent: Jul. 7, 2026

(54) TRANSMITTER DEVICE AND SEMICONDUCTOR DEVICE

(71) Applicant: Kioxia Corporation, Tokyo (JP)

(72) Inventor: Takashi Toi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/980,414

(22) Filed: Dec. 13, 2024

(65) Prior Publication Data

US 2025/0300663 A1 Sep. 25, 2025

(30) Foreign Application Priority Data

Mar. 21, 2024 (JP) ................................. 2024-045437

(51) Int. Cl.
　*H03L 7/081* (2006.01)
　*H03L 7/24* (2006.01)
(52) U.S. Cl.
　CPC .............. *H03L 7/0814* (2013.01); *H03L 7/24* (2013.01)
(58) Field of Classification Search
　CPC ................................ H03L 7/0814; H03L 7/24
　USPC ......................................................... 327/158
　See application file for complete search history.

(56) References Cited

U.S. PATENT DOCUMENTS

| | | | | |
|---|---|---|---|---|
| 11,223,378 | B2 | 1/2022 | Toi | |
| 11,888,496 | B2 * | 1/2024 | Tachibana ............. | H03M 1/363 |
| 2014/0292378 | A1 | 10/2014 | Suzuki | |

FOREIGN PATENT DOCUMENTS

| | | |
|---|---|---|
| JP | 2014-192592 A | 10/2014 |
| JP | 2021-153231 A | 9/2021 |
| JP | 2022-148090 A | 10/2022 |

OTHER PUBLICATIONS

Ding et al., "A 112-GB/s PAM-4 Transmitter With a 2-Tap Fractional-Spaced FFE in 65-nm CMOS", IEEE Solid-State Circuits Letters, vol. 2, No. 9, 2019, 4 pages.
Dickson et al., "6.5 A 1.8pJ/b 56Gb/s PAM-4 Transmitter with Fractionally Spaced FFE in 14nm CMOS", IEEE: International Solid-State Circuits Conference (ISSCC), 2017, 3 pages.

* cited by examiner

*Primary Examiner* — Tomi Skibinski
(74) *Attorney, Agent, or Firm* — Oblon, McClelland, Maier & Neustadt, L.L.P.

(57) ABSTRACT

According to one embodiment, a transmitter device includes: a digital processing circuit generating n-phase first and second digital signals, the second digital signal shifted from the first digital signal by a first phase; a delay circuit generating an n-phase second clock signal shifted from an n-phase first clock signal by a second phase being 0 or more and being the first phase or less; a first multiplexer converting the first digital signal into a single-phase third digital signal based on the first clock signal; a second multiplexer converting the second digital signal into a single-phase fourth digital signal shifted from the third digital signal by a sum of the first phase and the second phase based on the second clock signal; and a first driver outputting a composite signal of first and second analog signals based on the third and fourth digital signals.

20 Claims, 5 Drawing Sheets

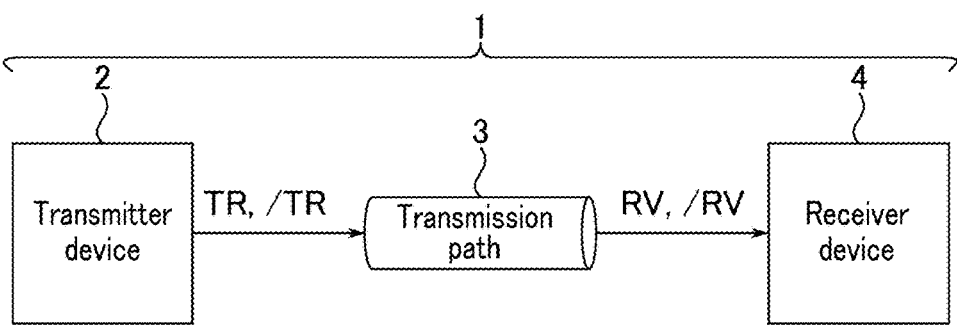
F I G. 1
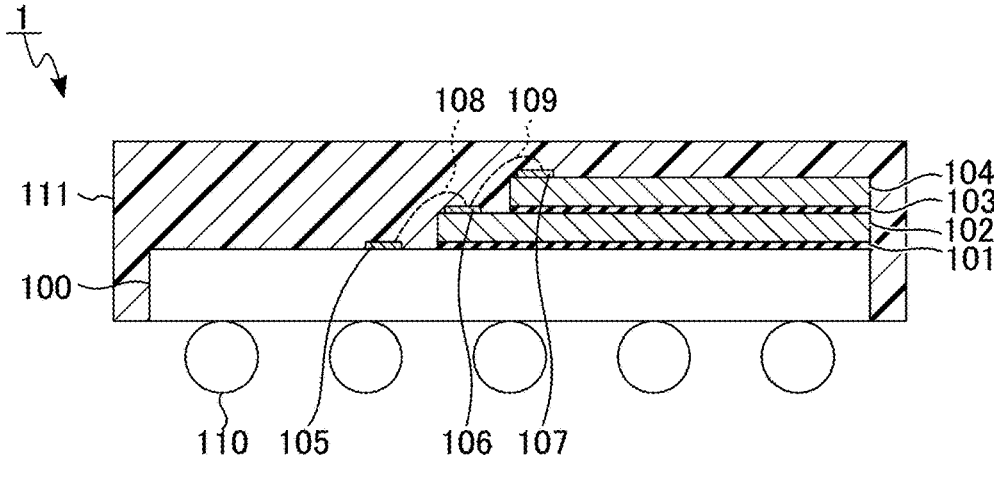
F I G. 2
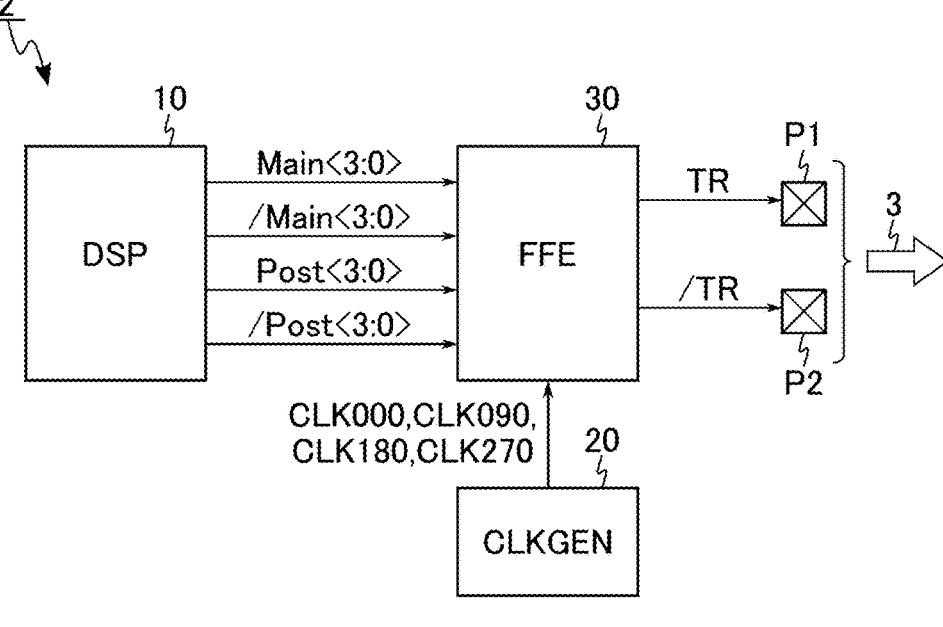
F I G. 3

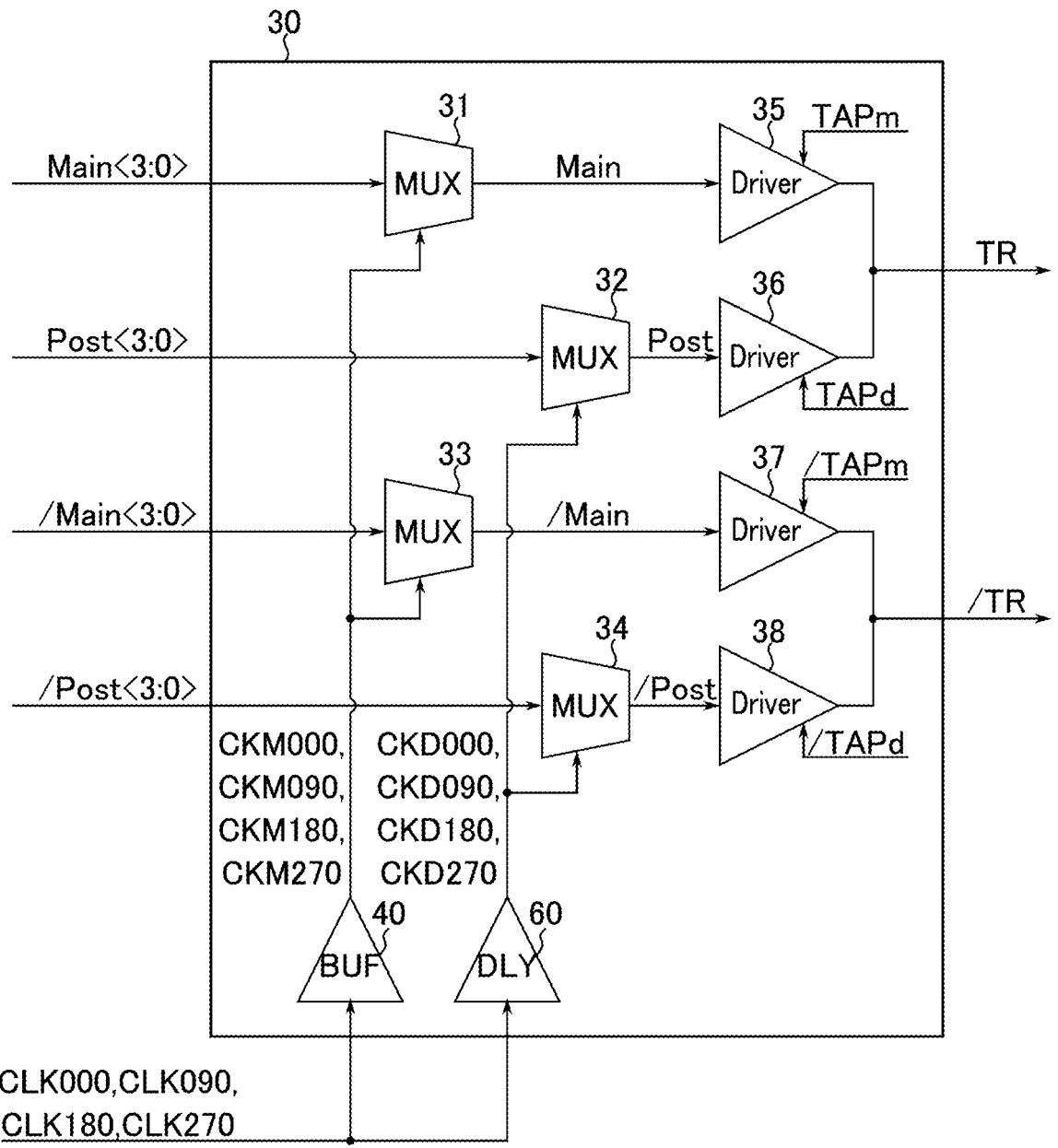
F I G. 4

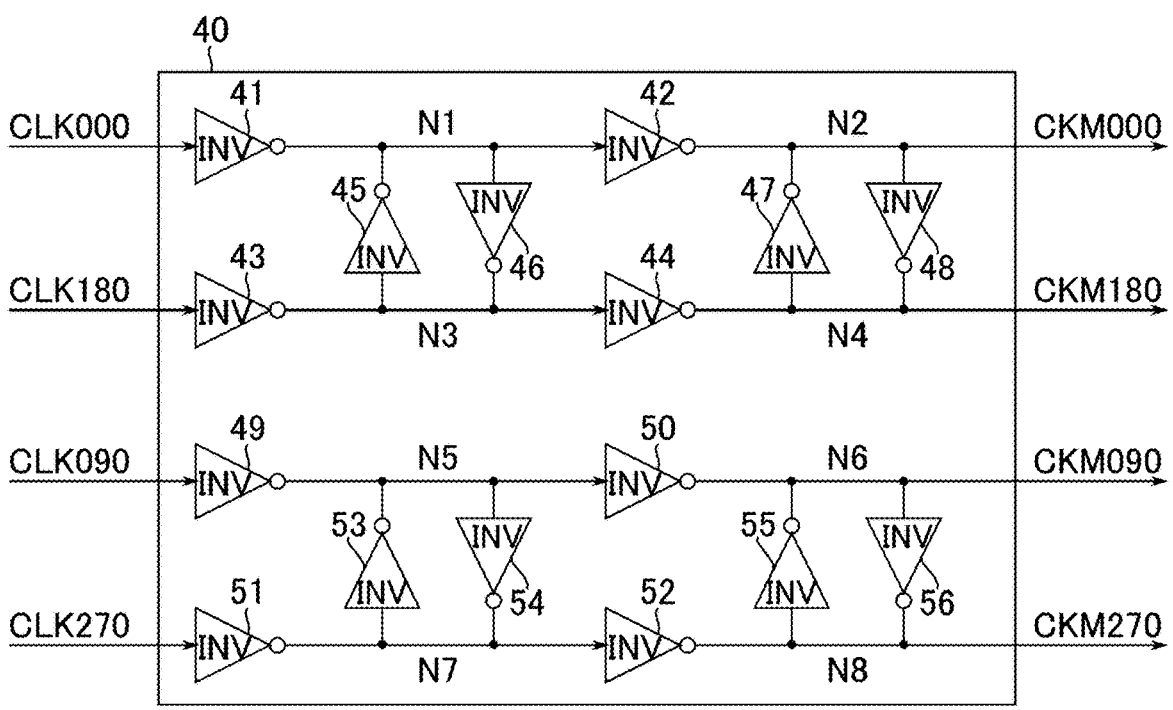
F I G. 5
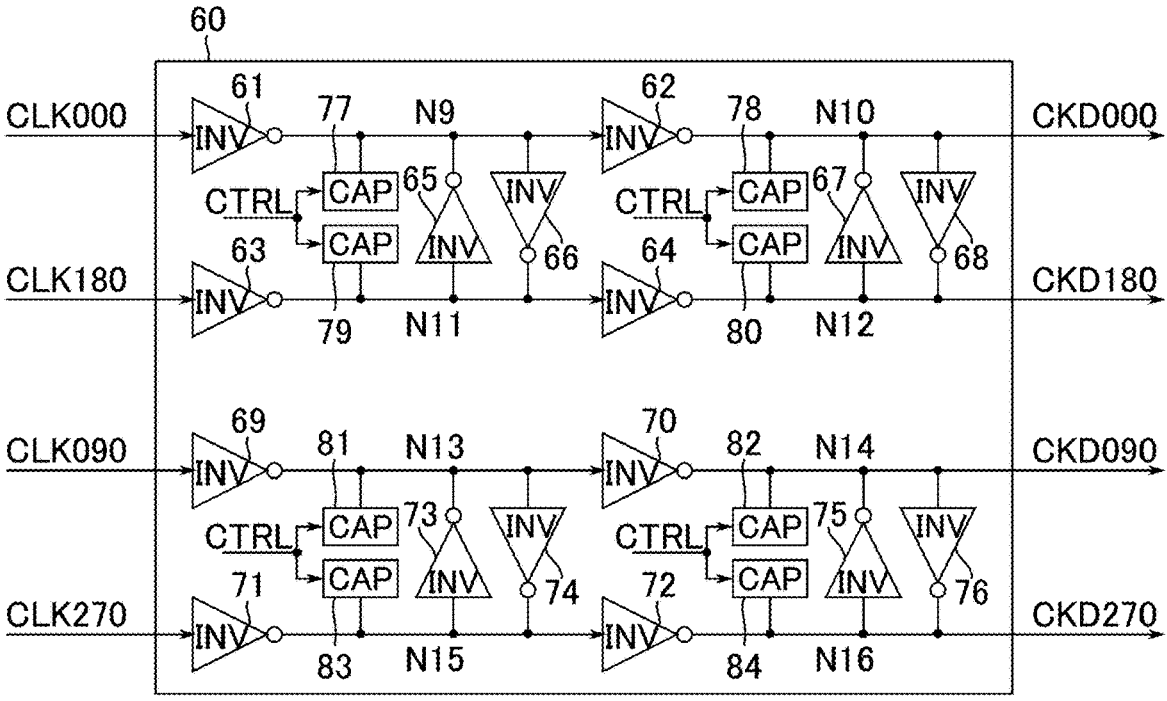
F I G. 6

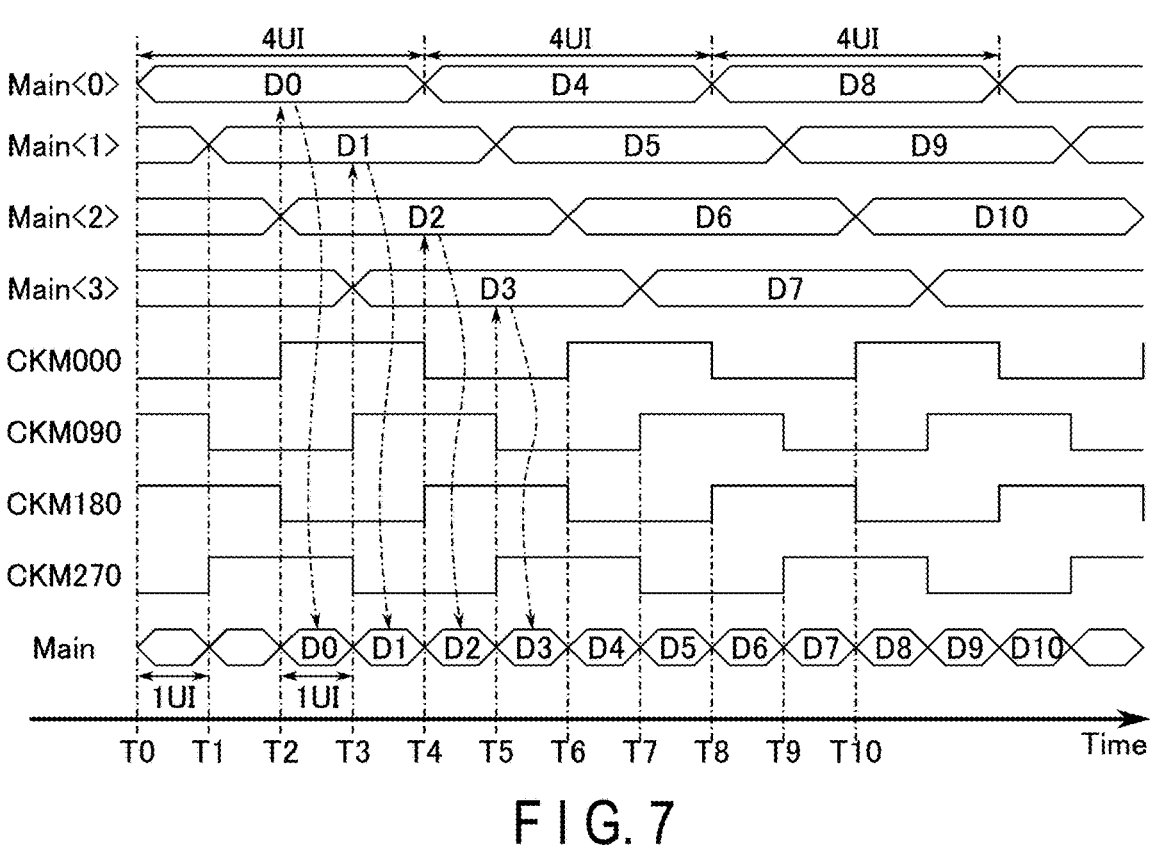
F I G. 7
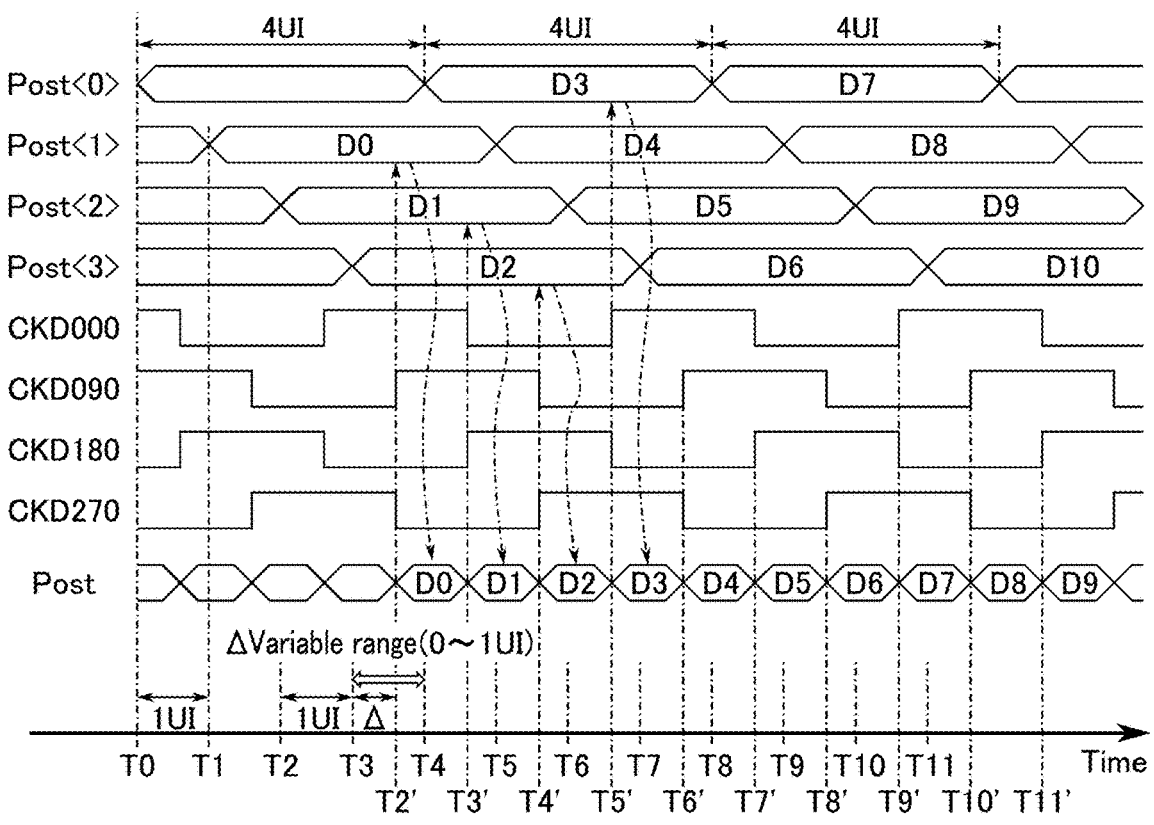
F I G. 8

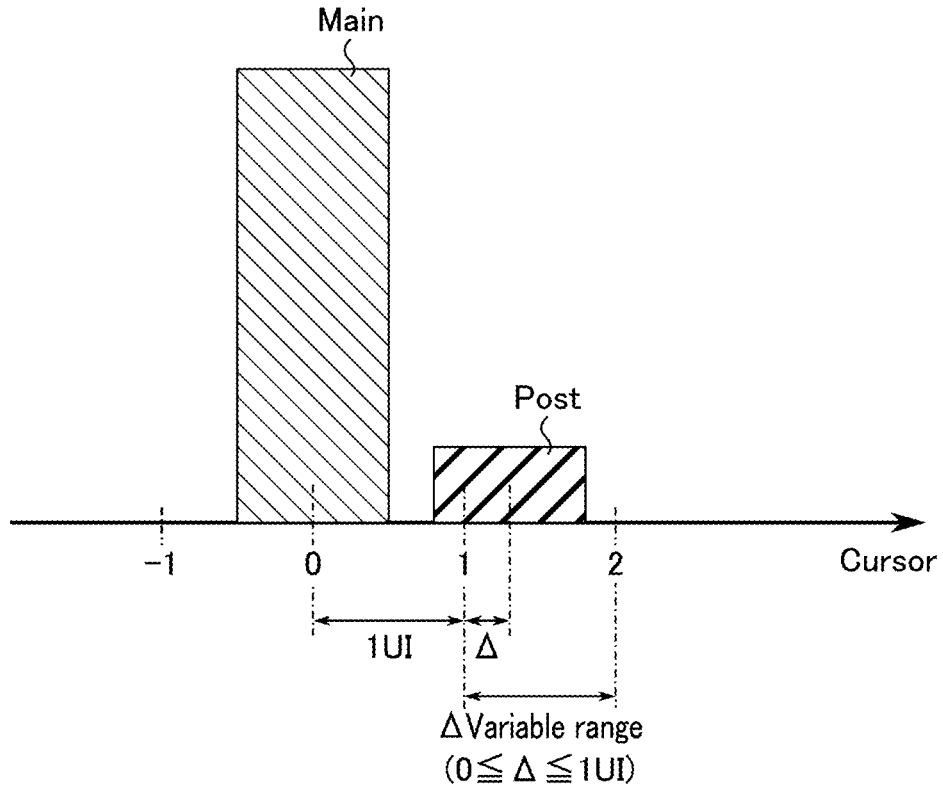
F I G. 9

TRANSMITTER DEVICE AND SEMICONDUCTOR DEVICE

CROSS-REFERENCE TO RELATED APPLICATIONS

This application is based upon and claims the benefit of priority from Japanese Patent Application No. 2024-045437, filed Mar. 21, 2024, the entire contents of which are incorporated herein by reference.

FIELD

Embodiments described herein relate generally to a transmitter device and a semiconductor device.

BACKGROUND

A transmitter device and a receiver device are connected via a transmission path. The transmitter device generates a digital signal on which data is superimposed. The transmitter device converts the digital signal into an analog signal. The transmitter device transmits the analog signal to the receiver device via the transmission path. The receiver device generates a digital signal based on the analog signal. The receiver device recovers the data based on the generated digital signal.

BRIEF DESCRIPTION OF THE DRAWINGS

FIG. 1 is a block diagram showing an example of a configuration of a transmission/reception system including a transmitter device according to an embodiment.

FIG. 2 is a sectional view showing an example of a sectional structure of a semiconductor device including the transmission/reception system according to the embodiment.

FIG. 3 is a block diagram showing an example of a configuration of the transmitter device according to the embodiment.

FIG. 4 is a circuit diagram showing an example of a configuration of a feed forward equalizer included in the transmitter device according to the embodiment.

FIG. 5 is a circuit diagram showing an example of a configuration of a buffer circuit included in the feed forward equalizer according to the embodiment.

FIG. 6 is a circuit diagram showing an example of a configuration of a delay circuit included in the feed forward equalizer according to the embodiment.

FIG. 7 is a timing chart showing an example of an operation of generating a signal Main in the transmitter device according to the embodiment.

FIG. 8 is a timing chart showing an example of an operation of generating a signal Post in the transmitter device according to the embodiment.

FIG. 9 is a schematic view showing an example of a waveform of a signal TR output from the transmitter device according to the embodiment.

DETAILED DESCRIPTION

In general, according to one embodiment, a transmitter device includes a digital processing circuit configured to generate an n-phase first digital signal, and an n-phase second digital signal shifted from the first digital signal by a first phase, where n is an integer of not less than 2; a delay circuit configured to generate an n-phase second clock signal shifted from an n-phase first clock signal by a second phase; The second phase is larger than or equal to 0 and is less than or equal to the first phase; a first multiplexer configured to convert the first digital signal into a single-phase third digital signal based on the first clock signal; a second multiplexer configured to convert the second digital signal into a single-phase fourth digital signal shifted from the third digital signal by a sum of the first phase and the second phase based on the second clock signal; and a first driver configured to output a composite signal of a first analog signal based on the third digital signal and a second analog signal based on the fourth digital signal.

Hereinafter, embodiments will be described with reference to the drawings. Note that in the following description, the same reference numerals denote components having almost the same functions and configurations. To particularly discriminate elements having the same configuration, characters or numbers different from each other may be added to the end of the same reference numeral.

1. Configuration

1.1 Transmission/Reception System

The configuration of a transmission/reception system including a transmitter device according to an embodiment will be described first. FIG. 1 is a block diagram showing an example of a configuration of the transmission/reception system including the transmitter device according to the embodiment.

A transmission/reception system 1 is, for example, a transmission/reception system that implements wired serial communication. The transmission/reception system 1 is configured to transmit data from one device or circuit to another device or circuit. More specifically, the transmission/reception system 1 includes a transmitter device 2, a transmission path 3, and a receiver device 4.

The transmitter device 2 is configured to transmit signals TR and /TR to the receiver device 4 via the transmission path 3. The signals TR and /TR are differential signals. The signals TR and /TR are, for example, signals including a plurality of pulse signals. Data is superimposed on each pulse signal of the signals TR and /TR. The voltage level of each pulse signal of the signals TR and /TR corresponds to data of 1 or more bits. The data superimposed on the pulse signal is transmitted from the transmitter device 2 to the receiver device 4 via the transmission path 3.

The transmission path 3 is a physical or spatial transmission medium configured to transmit the signals TR and /TR to the receiver device 4. The transmission path 3 is, for example, a wiring that connects the transmitter device 2 and the receiver device 4. The transmission path 3 can have various transmission characteristics in accordance with the structure or material of the transmission medium. The transmission characteristics of the transmission path 3 include, for example, a frequency characteristic associated with a gain loss in a specific frequency band.

The signals TR and /TR transmitted by the transmitter device 2 suffer a loss according to the transmission characteristic of the transmission path 3 when the signals TR and /TR pass through the transmission path 3. This causes inter-symbol interference (ISI) in the signals TR and /TR which have passed through the transmission path 3. For this reason, the signals TR and /TR, which have passed through the transmission path 3, are processed as analog signals in a circuit of a first stage of the receiver device 4. The signals TR and /TR, which have passed through the transmission path 3 to suffer a loss, will be referred to as signals RV and /RV hereinafter.

The receiver device 4 is configured to receive the signals RV and /RV from the transmitter device 2 via 20 the transmission path 3. Based on the signals RV and /RV, the receiver device 4 decodes the data superimposed on the signals TR and /TR by the transmitter device 2. The receiver device 4 includes a reception circuit configured to correctly decode the data superimposed on the signals TR 25 and /TR.

FIG. 2 is a sectional view showing an example of a sectional structure of a semiconductor device including the transmission/reception system according to the embodiment. As shown in FIG. 2, the transmission/reception system 1 may be a semiconductor device including a wiring board 100, adhesive layers 101 and 103, semiconductor chips 102 and 104, pad electrodes 105, 106, and 107, wirings 108 and 109, a bump electrode 110, and a resin layer 111.

The wiring board 100 is, for example, a printed board or interposer using a glass epoxy resin. The pad electrode 105 is provided on an upper surface of the wiring board 100. The bump electrode 110 is provided on a lower surface of the wiring board 100.

The semiconductor chip 102 is provided, via the adhesive layer 101, in a region, which does not overlap the pad electrode 105, of the upper surface of the wiring board 100. For example, the receiver device 4 is formed as a semiconductor circuit on the semiconductor chip 102. The pad electrode 106 is provided on an upper surface of the semiconductor chip 102. The pad electrodes 105 and 106 are electrically connected by, for example, the wiring 108. The wiring 108 is, for example, a bonding wire.

The semiconductor chip 104 is provided, via the adhesive layer 103, in a region, which does not overlap the pad electrode 106, of the upper surface of the semiconductor chip 102. For example, the transmitter device 2 is formed as a semiconductor circuit on the semiconductor chip 104. The pad electrode 107 is provided on an upper surface of the semiconductor chip 104. The pad electrodes 106 and 107 are electrically connected by, for example, the wiring 109. The wiring 109 is, for example, a bonding wire functioning as the transmission path 3.

The resin layer 111 is a thermosetting resin, and is, for example, an epoxy resin or acrylic resin. The resin layer 111 seals the semiconductor chips 102 and 104, and covers part of the wiring board 100.

Note that the example shown in FIG. 2 has explained a case where the transmission/reception system 1 is the semiconductor device formed by the plurality of semiconductor chips 102 and 104 provided on the same wiring board 100 but the present invention is not limited to this. For example, the transmitter device 2 and the receiver device 4 may be provided on different wiring boards.

1.2 Transmitter Device

FIG. 3 is a block diagram showing an example of a configuration of the transmitter device according to the embodiment.

The transmitter device 2 includes, for example, pads P1 and P2, a DSP 10, a CLKGEN 20, and an FFE 30.

Each of the pads P1 and P2 is a terminal connected to the transmission path 3. The example of FIG. 3 shows a case where the pads P1 and P2 of the transmitter device 2 transmit the signals TR and /TR to the transmission path 3, respectively.

The DSP 10 is a digital processing circuit. The DSP 10 generates signals Main<3:0> and /Main<3:0> and signals Post<3:0> and /Post<3:0>. The DSP 10 outputs the signals Main<3:0> and /Main<3:0> and the signals Post<3:0> and /Post<3:0> to the FFE 30.

The signals Main<3:0> and /Main<3:0> are 4-phase digital signals. Transmission data are parallelly superimposed on the signals Main<3:0> and /Main<3:0> at, for example, a 4-UI (Unit Interval) period. The phases of signals Main<1> and /Main<1> are delayed by 1 UI with respect to the phases of signals Main<0> and /Main<0>. The phases of signals Main<2> and /Main<2> are delayed by 1 UI with respect to the phases of the signals Main<1> and /Main<1>. The phases of signals Main<3> and /Main<3> are delayed by 1 UI with respect to the phases of the signals Main<2> and /Main<2>. The signals Main<0> and /Main<0> are differential signals. The signals Main<1> and /Main<1> are differential signals. The signals Main<2> and /Main<2> are differential signals. The signals Main<3> and /Main<3> are differential signals.

The signals Post<3:0> and /Post <3:0> are 4-phase digital signals. Signals Post<1> and /Post<1> are differential signals, and are obtained by delaying the phases of the signals Main<0> and /Main<0> by 1 UI, respectively. Signals Post<2> and /Post<2> are differential signals, and are obtained by delaying the phases of the signals Main<1> and /Main<1> by 1 UI, respectively. Signals Post<3> and /Post<3> are differential signals, and are obtained by delaying the phases of the signals Main<2> and /Main<2> by 1 UI, respectively. Signals Post<0> and /Post<0> are differential signals, and are obtained by delaying the phases of the signals Main<3> and /Main<3> by 1 UI, respectively.

The CLKGEN 20 is a clock generation circuit. The CLKGEN 20 generates signals CLK000, CLK090, CLK180, and CLK270. The CLKGEN 20 outputs the signals CLK000, CLK090, CLK180, and CLK270 to the FFE 30.

The signals CLK000, CLK090, CLK180, and CLK270 are, for example, 4-phase clock signals having a 4-UI period. The signal CLK090 is delayed by 1 UI with respect to the signal CLK000. The signal CLK180 is delayed by 1 UI with respect to the signal CLK090. The signal CLK270 is delayed by 1 UI with respect to the signal CLK180. The signals CLK000, CLK090, CLK180, and CLK270 are configured to rise at timings of confirming the data of the signals Main<0> and /Main<0>, the signals Main<1> and /Main<1>, the signals Main<2> and /Main<2>, and the signals Main<3> and /Main<3>, respectively.

The FFE 30 is, for example, a feed forward equalizer. The FFE 30 generates the signal TR based on the signals Main<3:0> and Post<3:0> and the signals CLK000, CLK090, CLK180, and CLK270. The FFE 30 generates the signal /TR based on the signals /Main<3:0> and /Post<3:0> and the signals CLK000, CLK090, CLK180, and CLK270. The FFE 30 outputs the signals TR and /TR to the pads P1 and P2, respectively.

1.3 Feed Forward Equalizer

An internal configuration of the feed forward equalizer (FFE) included in the transmitter device according to the embodiment will be described next. FIG. 4 is a circuit diagram showing an example of a configuration of the feed forward equalizer included in the transmitter device according to the embodiment.

The FFE 30 includes MUXs 31, 32, 33, and 34, a plurality of drivers 35, 36, 37, and 38, a BUF 40, and a DLY 60.

The BUF 40 is a buffer circuit. The BUF 40 receives the signals CLK000, CLK090, CLK180, and CLK270 from the CLKGEN 20. The BUF 40 generates signals CKM000, CKM090, CKM180, and CKM270 based on the signals CLK000, CLK090, CLK180, and CLK270, and outputs these signals to the MUXs 31 and 33. An internal configuration of the BUF 40 will be described later.

The signals CKM000, CKM090, CKM180, and CKM270 are signals obtained by delaying the signals CLK000, CLK090, CLK180, and CLK270 by a particular phase, respectively. That is, the signals CKM000, CKM090, CKM180, and CKM270 are clock signals having a 4-UI period, and are shifted in phase by 1 UI in this order.

The DLY 60 is a delay circuit. The DLY 60 receives the signals CLK000, CLK090, CLK180, and CLK270 from the CLKGEN 20. The DLY 60 generates signals CKD000, CKD090, CKD180, and CKD270 based on the signals CLK000, CLK090, CLK180, and CLK270, and outputs these signals to the MUXs 32 and 34. An internal configuration of the DLY 60 will be described later.

The signals CKD000, CKD090, CKD180, and CKD270 are signals obtained by further delaying the signals CKM000, CKM090, CKM180, and CKM270 by a phase A, respectively. That is, the signals CKD000, CKD090, CKD180, and CKD270 are clock signals having a 4-UI period, and are shifted in phase by 1 UI in this order. The phase A is preset to a particular value within a range of 0 (inclusive) to 1 UI (inclusive) ($0 \leq A \leq 1$ UI).

Each of the MUXs 31 to 34 is a 4-to-1 multiplexer. Each of the MUXs 31 to 34 is configured to serially output, to one signal line, data parallelly input from four signal lines by using a clock signal as a trigger.

More specifically, the MUX 31 receives the signal Main<3:0> from the DSP 10. The MUX 31 receives the signals CKM000, CKM090, CKM180, and CKM270 from the BUF 40. The MUX 31 generates a signal Main from the signal Main<3:0> based on the signals CKM000, CKM090, CKM180, and CKM270. More specifically, the MUX 31 acquires the signals Main<0>, Main<1>, Main<2>, and Main<3> when the signals CKM000, CKM090, CKM180, and CKM270 rise, respectively, and outputs them as a single-phase signal Main. The MUX 31 outputs the signal Main to the driver 35. The signal Main includes data obtained by serially converting data parallelly superimposed on the signal Main<3:0>. Transmission data are serially superimposed on the signal Main at a 1-UI period (that is, at ¼ of the period of the signal Main<3:0>).

The MUX 32 receives the signal Post<3:0> from the DSP 10. The MUX 32 receives the signals CKD000, CKD090, CKD180, and CKD270 from the DLY 60. The MUX 32 generates a signal Post from the signal Post<3:0> based on the signals CKD000, CKD090, CKD180, and CKD270. More specifically, the MUX 32 acquires the signals Post<0>, Post<1>, Post<2>, and Post<3> when the signals CKD000, CKD090, CKD180, and CKD270 rise, respectively, and outputs them as a single-phase signal Post. The MUX 32 outputs the signal Post to the driver 36. The signal Post includes data obtained by serially converting data parallelly superimposed on the signal Post<3:0>. Transmission data are serially superimposed on the signal Post at a 1-UI period (that is, at ¼ of the period of the signal Post<3:0>). The signal Post is output to be delayed by the phase A with respect to the signal Main. That is, the signal Post is output to be delayed by a phase (1 UI+A) with respect to the signal Main.

The MUX 33 receives the signal /Main<3:0> from the DSP 10. The MUX 33 receives the signals CKM000, CKM090, CKM180, and CKM270 from the BUF 40. The MUX 33 generates a signal /Main from the signal /Main<3:0> based on the signals CKM000, CKM090, CKM180, and CKM270. More specifically, the MUX 33 acquires the signals /Main<0>, /Main<1>, /Main<2>, and /Main<3> when the signals CKM000, CKM090, CKM180, and CKM270 rise, respectively, and outputs them as a single-phase signal /Main. The MUX 33 outputs the signal /Main to the driver 37. The signal /Main includes data obtained by serially converting data parallelly superimposed on the signal /Main<3:0>. The signals Main and /Main are the differential signals.

The MUX 34 receives the signal /Post<3:0> from the DSP 10. The MUX 34 receives the signals CKD000, CKD090, CKD180, and CKD270 from the DLY 60. The MUX 34 generates a signal /Post from the signal /Post<3:0> based on the signals CKD000, CKD090, CKD180, and CKD270. More specifically, the MUX 34 acquires the signals /Post<0>, /Post<1>, /Post<2>, and /Post<3> when the signals CKD000, CKD090, CKD180, and CKD270 rise, respectively, and outputs them as a single-phase signal /Post. The MUX 34 outputs the signal /Post to the driver 38. The signal /Post includes data obtained by serially converting data parallelly superimposed on the signal /Post<3:0>. The signal Post and /Post are the differential signals.

Each of the drivers 35 to 38 may be an SST driver (Source Series Termination driver). Each of the drivers 35 to 38 is configured to convert an input digital signal into an analog signal and output it while adjusting an output impedance.

More specifically, the driver 35 receives the signal Main. The driver 35 converts the signal Main into an analog signal based on a control signal TAPm. The control signal TAPm decides an amplitude of the analog signal generated by the driver 35. The driver 36 receives the signal Post. The driver 36 converts the signal Post into an analog signal based on a control signal TAPd. The control signal TAPd decides an amplitude of the analog signal generated by the driver 36. The analog signal generated by the driver 35 and the analog signal generated by the driver 36 are composited and output as the signal TR to the pad P1.

The driver 37 receives the signal /Main. The driver 37 converts the signal /Main into an analog signal based on a control signal /TAPm. The control signal /TAPm decides an amplitude of the analog signal generated by the driver 37. The driver 38 receives the signal /Post. The driver 38 converts the signal /Post into an analog signal based on a control signal /TAPd. The control signal /TAPd decides an amplitude of the analog signal generated by the driver 38. The analog signal generated by the driver 37 and the analog signal generated by the driver 38 are composited and output as the signal /TR to the pad P2.

1.4 Buffer Circuit

The internal configuration of the buffer circuit (BUF 40) included in the feed forward equalizer according to the embodiment will be described next. FIG. 5 is a circuit diagram showing an example of a configuration of the buffer circuit included in the feed forward equalizer according to the embodiment.

The BUF 40 includes INVs 41, 42, 43, 44, 45, 46, 47, 48, 49, 50, 51, 52, 53, 54, 55, and 56.

Each of the INVs 41 to 56 is an inverter. Each of the INVs 41 to 56 is configured to invert an input signal and output it.

More specifically, the signal CLK000 is input to an input terminal of the INV 41. An output terminal of the INV 41 is connected to a node N1.

An input terminal of the INV 42 is connected to the node N1. An output terminal of the INV 42 is connected to a node N2.

The signal CLK180 is input to an input terminal of the INV 43. An output terminal of the INV 43 is connected to a node N3.

An input terminal of the INV 44 is connected to the node N3. An output terminal of the INV 44 is connected to a node N4.

An input terminal of the INV 45 is connected to the node N3. An output terminal of the INV 45 is connected to the node N1.

An input terminal of the INV 46 is connected to the node N1. An output terminal of the INV 46 is connected to the node N3.

An input terminal of the INV 47 is connected to the node N4. An output terminal of the INV 47 is connected to the node N2.

An input terminal of the INV 48 is connected to the node N2. An output terminal of the INV 48 is connected to the node N4.

In the above-described configuration of the INVs 41 to 48, the signals CKM000 and CKM180 are output from the nodes N2 and N4, respectively.

Furthermore, the signal CLK090 is input to an input terminal of the INV 49. An output terminal of the INV 49 is connected to a node N5.

An input terminal of the INV 50 is connected to the node N5. An output terminal of the INV 50 is connected to a node N6.

The signal CLK270 is input to an input terminal of the INV 51. An output terminal of the INV 51 is connected to a node N7.

An input terminal of the INV 52 is connected to the node N7. An output terminal of the INV 52 is connected to a node N8.

An input terminal of the INV 53 is connected to the node N7. An output terminal of the INV 53 is connected to the node N5.

An input terminal of the INV 54 is connected to the node N5. An output terminal of the INV 54 is connected to the node N7.

An input terminal of the INV 55 is connected to the node N8. An output terminal of the INV 55 is connected to the node N6.

An input terminal of the INV 56 is connected to the node N6. An output terminal of the INV 56 is connected to the node N8.

In the above-described configuration of the INVs 49 to 56, the signals CKM090 and CKM270 are output from the nodes N6 and N8, respectively.

1.5 Delay Circuit

The internal configuration of the delay circuit (DLY 60) included in the feed forward equalizer according to the embodiment will be described next. FIG. 6 is a circuit diagram showing an example of a configuration of the delay circuit included in the feed forward equalizer according to the embodiment.

The DLY 60 includes INVs 61, 62, 63, 64, 65, 66, 67, 68, 69, 70, 71, 72, 73, 74, 75, and 76, and CAPs 77, 78, 79, 80, 81, 82, 83, and 84.

Each of the INVs 61 to 76 is an inverter. Each of the INVs 61 to 76 is configured to invert an input signal and output it. Each of the CAPs 77 to 84 is a variable capacitance capacitor. Each of the CAPs 77 to 84 can set a capacitance to a particular value based on a control signal CTRL.

More specifically, the signal CLK000 is input to an input terminal of the INV61. An output terminal of the INV 61 is connected to a node N9.

An input terminal of the INV 62 is connected to the node N9. An output terminal of the INV 62 is connected to a node N10.

The signal CLK180 is input to an input terminal of the INV 63. An output terminal of the INV 63 is connected to a node N11.

An input terminal of the INV 64 is connected to the node N11. An output terminal of the INV 64 is connected to a node N12.

An input terminal of the INV 65 is connected to the node N11. An output terminal of the INV 65 is connected to the node N9.

An input terminal of the INV 66 is connected to the node N9. An output terminal of the INV 66 is connected to the node N11.

An input terminal of the INV 67 is connected to the node N12. An output terminal of the INV 67 is connected to the node N10.

An input terminal of the INV 68 is connected to the node N10. An output terminal of the INV 68 is connected to the node N12.

The CAP 77 is connected to the node N9. The CAP 78 is connected to the node N10. The CAP 79 is connected to the node N11. The CAP 80 is connected to the node N12. Each of the CAPs 77 to 80 is further connected to, for example, a wiring to which a reference potential at the time of the operation of the DLY 60 is applied.

In the above-described configuration of the INVs 61 to 68 and the CAPs 77 to 80, the signals CKD000 and CKD180 are output from the nodes N10 and N12, respectively.

Furthermore, the signal CLK090 is input to an input terminal of the INV 69. An output terminal of the INV 69 is connected to a node N13.

An input terminal of the INV 70 is connected to the node N13. An output terminal of the INV 70 is connected to a node N14.

The signal CLK270 is input to an input terminal of the INV 71. An output terminal of the INV 71 is connected to a node N15.

An input terminal of the INV 72 is connected to the node N15. An output terminal of the INV 72 is connected to a node N16.

An input terminal of the INV 73 is connected to the node N15. An output terminal of the INV 73 is connected to the node N13.

An input terminal of the INV 74 is connected to the node N13. An output terminal of the INV 74 is connected to the node N15.

An input terminal of the INV 75 is connected to the node N16. An output terminal of the INV 75 is connected to the node N14.

An input terminal of the INV 76 is connected to the node N14. An output terminal of the INV 76 is connected to the node N16.

The CAP 81 is connected to the node N13. The CAP 82 is connected to the node N14. The CAP 83 is connected to the node N15. The CAP 84 is connected to the node N16. Each of the CAPs 81 to 84 is further connected to, for example, the wiring to which the reference potential at the time of the operation of the DLY 60 is applied.

In the above-described configuration of the INVs 69 to 76 and the CAPs 81 to 84, the signals CKD090 and CKD270 are output from the nodes N14 and N16, respectively.

2. Operation

An operation of the transmitter device according to the embodiment will be described next.

2.1 Operation of Generating Signal Main

An operation of generating the signal Main in the transmitter device according to the embodiment will be described first. FIG. 7 is a timing chart showing an example of the operation of generating the signal Main in the transmitter device according to the embodiment. FIG. 7 shows, in time series, the relationship among the data superimposed on the signals Main<3:0> and Main and the signals CKM000, CKM090, CKM180, and CKM270.

As shown in FIG. 7, the signal Main<3:0> includes data different for each period of 4 UIs. More specifically, the signal Main<0> includes data D0 for 4 UIs from time T0 to time T4, includes data D4 for 4 UIs from time T4 to time T8, and includes data D8 for 4 UIs from time T8. The signal Main<1> includes data D1 for 4 UIs from time T1 to time T5, includes data D5 for 4 UIs from time T5 to time T9, and includes data D9 for 4 UIs from time T9. Time T1, T5, or T9 is time after 1 UI elapses from time T0, T4, or T8. The signal Main<2> includes data D2 for 4 UIs from time T2 to time T6, includes data D6 for 4 UIs from time T6 to time T10, and includes data D10 for 4 UIs from time T10. Time T2, T6, or T10 is time after 1 UI elapses from time T1, T5, or T9. The signal Main<3> includes data D3 for 4 UIs from time T3 to time T7, and includes data D7 for 4 UIs from time T7. Time T3 or T7 is time after 1 UI elapses from time T2 or T6.

At time T2, the MUX 31 acquires the signal Main<0> when the signal CKM000 rises. The MUX 31 outputs, as the signal Main, the data D0 included in the signal Main<0>.

At time T3 after 1 UI elapses from time T2, the MUX 31 acquires the signal Main<1> when the signal CKM090 rises. The MUX 31 outputs, as the signal Main, the data D1 included in the signal Main<1>.

At time T4 after 1 UI elapses from time T3, the MUX 31 acquires the signal Main<2> when the signal CKM180 rises. The MUX 31 outputs, as the signal Main, the data D2 included in the signal Main<2>.

At time T5 after 1 UI elapses from time T4, the MUX 31 acquires the signal Main<3> when the signal CKM270 rises. The MUX 31 outputs, as the signal Main, the data D3 included in the signal Main<3>.

Subsequently, similarly, the MUX 31 outputs, as the signal Main, the data included in the signal Main<3:0> for every 1 UI. This allows the MUX 31 to output the signal Main including the data D0, D1, D2, D3, . . . at a 1-UI period.

Note that the operation of generating the signal Main by the MUX 31 has been explained with reference to the example shown in FIG. 7 but an operation of generating the signal /Main by the MUX 33 is the same as the operation of generating the signal Main.

2.2 Operation of Generating Signal Post

An operation of generating the signal Post in the transmitter device according to the embodiment will be described next. FIG. 8 is a timing chart showing an example of the operation of generating the signal Post in the transmitter device according to the embodiment. FIG. 8 shows, in time series, the relationship among the data superimposed on the signals Post<3:0> and Post and the signals CKD000, CKD090, CKD180, and CKD270.

As shown in FIG. 8, the signal Post<3:0> includes data different for each period of 4 UIs. More specifically, the signal Post<1> includes data D0 for 4 UIs from time T1 to time T5, includes data D4 for 4 UIs from time T5 to time T9, and includes data D8 for 4 UIs from time T9. The signal Post<2> includes data D1 for 4 UIs from time T2 to time T6, includes data D5 for 4 UIs from time T6 to time T10, and includes data D9 for 4 UIs from time T10. The signal Post<3> includes data D2 for 4 UIs from time T3 to time T7, includes data D6 for 4 UIs from time T7 to time T11, and includes data D10 for 4 UIs from time T11. Time T11 is time after 1 UI elapses from time T10. The signal Post<0> includes data D3 for 4 UIs from time T4 to time T8, and includes data D7 for 4 UIs from time T8. Time T8 is time after 1 UI elapses from time T7.

At time T2' after (1 UI+Δ) elapses from time T2, the MUX 33 acquires the signal Post<1> when the signal CKD090 rises. The MUX 33 outputs, as the signal Post, the data D0 included in the signal Post<1>.

At time T3' after 1 UI elapses from time T2' (that is, after (1 UI+Δ) elapses from time T3), the MUX 33 acquires the signal Post<2> when the signal CKD180 rises. The MUX 33 outputs, as the signal Post, the data D1 included in the signal Post<2>.

At time T4' after 1 UI elapses from time T3' (that is, after (1 UI+Δ) elapses from time T4), the MUX 33 acquires the signal Post<3> when the signal CKD270 rises. The MUX 33 outputs, as the signal Post, the data D2 included in the signal Post<3>.

At time T5' after 1 UI elapses from time T4' (that is, after (1 UI+Δ) elapses from time T5), the MUX 33 acquires the signal Post<0> when the signal CKD000 rises. The MUX 33 outputs, as the signal Post, the data D3 included in the signal Post<0>.

Subsequently, similarly, the MUX 33 outputs, as the signal Post, the data included in the signal Post<3:0> for every 1 UI. This allows the MUX 33 to output the signal Post including the data D0, D1, D2, D3, . . . at a 1-UI period to be delayed by (1 UI+4) with respect to the signal Main. In other words, the MUX 33 can output the signal Post to be delayed by an arbitrary time within the range of 1 UI (inclusive) to 2 UIs (inclusive) with respect to the signal Main.

Note that the operation of generating the signal Post by the MUX 33 has been explained with reference to the example shown in FIG. 8 but an operation of generating the signal /Post by the MUX 34 is the same as the operation of generating the signal Post.

2.3 Output Waveform of Signal TR

The signal TR output from the transmitter device according to the embodiment will be described next. FIG. 9 is a schematic view showing an example of a waveform of the signal TR output from the transmitter device according to the embodiment. FIG. 9 shows the waveform of a portion corresponding to 1 bit of the signal TR.

As shown in FIG. 9, the signal TR includes a portion corresponding to the signal Main at a main cursor (Cursor=0). The signal Main is output for 1 UI by centering the main cursor. Furthermore, the signal TR includes a portion corresponding to the signal Post between post cursor 1 (Cursor=1) and post cursor 2 (Cursor=2). The signal Post is output for 1 UI by, for example, centering time delayed by (1 UI+Δ) from the main cursor.

As described above, the FFE 30 can set A within the range of 0 UI (inclusive) to 1 UI. This can include the signal Post in the signal TR to be delayed from the main cursor by an arbitrary time within the range of 1 UI to 2 UIS.

3. Effect of Embodiment

According to the embodiment, the DSP 10 generates the 4-phase signal Main<3:0> and the 4-phase signal Post<3:0> shifted from the signal Main<3:0> by 1 UI. The DLY 60 in the FFE 30 generates the 4-phase signals CKD000, CKD090, CKD180, and CKD270 by shifting the 4-phase signals CKM000, CKM090, CKM180, and CKM270 by A, respectively. The MUX 31 in the FFE 30 converts the signal Main<3:0> into the single-phase signal Main based on the signals CKM000, CKM090, CKM180, and CKM270. The MUX 32 in the FFE 30 converts the signal Post<3:0> into the single-phase signal Post based on the signals CKD000, CKD090, CKD180, and CKD270. The signal Post is a signal obtained by shifting the signal Main by (1 UI+Δ). The drivers 35 and 36 output, to the pad P1, the signal TR as a composite signal of the analog signal based on the signal Main and the analog signal based on the signal Post. This can add a waveform corresponding to a portion between post cursors 1 and 2, as shown in FIG. 9. Therefore, it is possible to generate an analog signal suitable for the receiver device 4.

Supplementarily explaining, the reception circuit in the receiver device 4 includes a CTLE (Continuous Time Linear Equalizer). The CTLE boosts high-frequency components of the signals RV and /RV by Q-shaping with respect to low-frequency components. However, if high-frequency components are strongly boosted by Q-shaping, the attenuation coefficient of the transfer function of the CTLE can be a complex pole. In this case, a component having a polarity opposite to that of a component at the main cursor is generated between post cursors 1 and 2 of a signal output from the CTLE, which may worsen ISI (Inter-Symbol Interference).

According to the embodiment, as described above, the transmitter device 2 adds the waveform corresponding to the portion between post cursors 1 and 2 of the signal TR. This can compensate for waveform deterioration in the CTLE on the side of the receiver device 4. Therefore, even if the CTLE strongly boosts the high-frequency components by Q-shaping, it is possible to suppress ISI from worsening. Therefore, it is possible to provide the transmitter device that generates an analog signal suitable for the receiver device 4.

The FFE 30 further includes the MUXs 33 and 34 having the same arrangements as those of the MUXs 31 and 32, respectively. This can convert the signals /Main<3:0> and /Post<3:0> into the signals /Main and /Post while converting the signals Main<3:0> and Post<3:0> into the signals Main and Post. Therefore, the FFE 30 can output the signals TR and /TR as differential signals to the pads P1 and P2, respectively.

4. Modifications

Various modifications can be applied to the above-described embodiment.

The above-described embodiment has explained a case where the DSP 10 outputs the 4-phase signals Main<3:0>, Post<3:0>, /Main<3:0>, and /Post<3:0> to the FFE 30 but the present invention is not limited to this. For example, the DSP 10 may output n-phase signals Main<n−1:0>, Post<n−1:0>, /Main<n−1:0>, and /Post<n−1:0> to the FFE 30 (n is an integer of 2 or more).

In this case, the CLKGEN20 generates n-phase signals CLK000, CLK(360/n), . . . , CLK(360×(n−1)/n), and outputs them to the FFE 30. Then, the BUF 40 in the FFE 30 generates signals CKM000, CKM(360/n), . . . , CKM(360× (n−1)/n) based on the signals CLK000, CLK(360/n), . . . , CLK(360×(n−1)/n). Furthermore, the DLY 60 in the FFE 30 generates signals CKD000, CKD(360/n), . . . , CKD(360× (n−1)/n) based on the signals CLK000, CLK(360/n), . . . , CLK(360×(n−1)/n).

The MUX 31 acquires the signals Main<0>, Main<1>, . . . , Main<n−1> when the signals CKM000, CKM(360/n), . . . , CKM(360×(n−1)/n) rise, respectively, and outputs them as the single-phase signal Main. The MUX 32 acquires the signals Post<0>, Post<1>, . . . , and Post<n−1> when the signals CKD000, CKD(360/n), . . . , CKD(360×(n−1)/n) rise, respectively, and outputs them as the signal-phase signal Post. The MUX 33 acquires the signals /Main<0>, /Main<1>, . . . , and /Main<n−1> when the signals CKM000, CKM(360/n), . . . , CKM(360×(n−1)/n) rise, respectively, and outputs them as the signal-phase signal /Main. The MUX 34 acquires the signals /Post<0>, /Post<1>, . . . , and /Post<n−1> when the signals CKD000, CKD(360/n), . . . , CKD(360×(n−1)/n) rise, respectively, and outputs them as the signal-phase signal /Post.

With the above-described configuration, for the arbitrary integer n of 2 or more, the FFE 30 can generate the signals Post and /Post by shifting the signals Main and /Main by (1 UI+Δ), respectively. This can obtain the same effect as in the embodiment.

The above-described embodiment has explained a case where 1-bit data is included for one symbol of the signals TR and /TR, but the present invention is not limited to this. For example, the signals TR and /TR may include data of 2 or more bits for one symbol.

While certain embodiments have been described, these embodiments have been presented by way of example only, and are not intended to limit the scope of the invention. Indeed, the embodiments described herein may be embodied in a variety of other forms; furthermore, various omissions, substitutions and changes in the form of the embodiments described herein may be made without departing from the spirit of the inventions. The embodiments and modifications are included in the scope and spirit of the invention and are included in the scope of the claimed inventions and their equivalents.

What is claimed is:

1. A transmitter device comprising:
   a digital processing circuit configured to generate an n-phase first digital signal, and an n-phase second digital signal shifted from the first digital signal by a first phase, where n is an integer of not less than 2;
   a delay circuit configured to generate an n-phase second clock signal shifted from an n-phase first clock signal by a second phase, the second phase being larger than or equal to 0 and being less than or equal to the first phase;
   a first multiplexer configured to convert the first digital signal into a single-phase third digital signal based on the first clock signal;
   a second multiplexer configured to convert the second digital signal into a single-phase fourth digital signal shifted from the third digital signal by a sum of the first phase and the second phase based on the second clock signal; and a first driver configured to output a composite signal of a first analog signal based on the third digital signal and a second analog signal based on the fourth digital signal.

2. The transmitter device according to claim 1, wherein the digital processing circuit further generates an n-phase fifth digital signal, and an n-phase sixth digital signal shifted from the fifth digital signal by the first phase, the first digital signal and the fifth digital signal are differential signals, the second digital signal and the sixth digital signal are differential signals, and the transmitter device further comprises a third multiplexer configured to convert the fifth digital signal into a single-phase seventh digital signal based on the first clock signal, a fourth multiplexer configured to convert the sixth digital signal into a single-phase eighth digital signal shifted from the seventh digital signal by the sum based on the second clock signal, and a second driver configured to output a composite signal of a third analog signal based on the seventh digital signal and a fourth analog signal based on the eighth digital signal.

3. The transmitter device according to claim 1, wherein a period of the third digital signal is 1/n of a period of the first digital signal, and a period of the fourth digital signal is 1/n of a period of the second digital signal.

4. The transmitter device according to claim 3, wherein the period of the third digital signal and the period of the fourth digital signal correspond to the first phase.

5. The transmitter device according to claim 1, wherein each conversion by the first multiplexer and the second multiplexer includes conversion from a parallel signal into a serial signal.

6. The transmitter device according to claim 1, wherein the first driver includes an SST driver (Source Series Termination Driver).

7. The transmitter device according to claim 1, further comprising: a pad configured to output the composite signal of the first analog signal and the second analog signal to an outside of the transmitter device.

8. The transmitter device according to claim 1, wherein the third digital signal is located at a first cursor, and the fourth digital signal is located between a second cursor separated from the first cursor by the first phase and a third cursor separated from the second cursor by the first phase on an opposite side of the first cursor.

9. The transmitter device according to claim 8, wherein the first cursor is a main cursor, and the second cursor and the third cursor are post cursors.

10. A semiconductor device comprising: a wiring board; a first semiconductor chip provided on the wiring board and on which the transmitter device of claim 1 is formed as a semiconductor circuit; and a resin that seals the first semiconductor chip and covers part of the wiring board.

11. The semiconductor device according to claim 10, wherein the digital processing circuit further generates an n-phase fifth digital signal, and an n-phase sixth digital signal shifted from the fifth digital signal by the first phase, the first digital signal and the fifth digital signal are differential signals, the second digital signal and the sixth digital signal are differential signals, and the transmitter device further comprises a third multiplexer configured to convert the fifth digital signal into a single-phase seventh digital signal based on the first clock signal, a fourth multiplexer configured to convert the sixth digital signal into a single-phase eighth digital signal shifted from the seventh digital signal by the sum based on the second clock signal, and a second driver configured to output a composite signal of a third analog signal based on the seventh digital signal and a fourth analog signal based on the eighth digital signal.

12. The semiconductor device according to claim 10, wherein a period of the third digital signal is 1/n of a period of the first digital signal, and a period of the fourth digital signal is 1/n of a period of the second digital signal.

13. The semiconductor device according to claim 12, wherein the period of the third digital signal and the period of the fourth digital signal correspond to the first phase.

14. The semiconductor device according to claim 10, wherein each conversion by the first multiplexer and the second multiplexer includes conversion from a parallel signal into a serial signal.

15. The semiconductor device according to claim 10, wherein the first driver includes an SST driver (Source Series Termination Driver).

16. The semiconductor device according to claim 10, wherein the transmitter device further comprising: a pad configured to output the composite signal of the first analog signal and the second analog signal to an outside of the transmitter device.

17. The semiconductor device according to claim 16, further comprising: a second semiconductor chip on which a receiver device configured to communicate with the transmitter device is formed as a semiconductor circuit; and a wiring configured to electrically connect the pad and the second semiconductor chip.

18. The semiconductor device according to claim 17, wherein the second semiconductor chip is provided on the wiring board, and sealed by the resin.

19. The semiconductor device according to claim 10, wherein the third digital signal is located at a first cursor, and the fourth digital signal is located between a second cursor separated from the first cursor by the first phase and a third cursor separated from the second cursor by the first phase on an opposite side of the first cursor.

20. The semiconductor device according to claim 19, wherein the first cursor is a main cursor, and the second cursor and the third cursor are post cursors.

* * * * *